United States Patent
Frey et al.

(10) Patent No.: US 11,081,615 B2
(45) Date of Patent: Aug. 3, 2021

(54) PROTECTION METHOD FOR THROUGH-HOLES OF A SEMICONDUCTOR WAFER

(71) Applicant: AZUR SPACE Solar Power GmbH, Heilbronn (DE)

(72) Inventors: Alexander Frey, Heilbronn (DE); Benjamin Hagedorn, Ellhofen (DE)

(73) Assignee: AZUR SPACE Solar Power GmbH, Heilbronn (DE)

( * ) Notice: Subject to any disclaimer, the term of this patent is extended or adjusted under 35 U.S.C. 154(b) by 0 days.

(21) Appl. No.: 17/007,566

(22) Filed: Aug. 31, 2020

(65) Prior Publication Data

US 2021/0066532 A1   Mar. 4, 2021

(30) Foreign Application Priority Data

Aug. 29, 2019   (DE) .................... 10 2019 006 093.8

(51) Int. Cl.
*H01L 31/18* (2006.01)
*H01L 31/0224* (2006.01)

(52) U.S. Cl.
CPC ...... *H01L 31/186* (2013.01); *H01L 31/02245* (2013.01); *H01L 31/184* (2013.01); *H01L 31/1876* (2013.01)

(58) Field of Classification Search
CPC ............. H01L 21/76898; H01L 23/481; H01L 23/5389; H01L 25/0657; H01L 31/02245;
(Continued)

(56) References Cited

U.S. PATENT DOCUMENTS 5,425,816 A    6/1995  Cavicchi et al.
9,680,035 B1 *  6/2017  Chary ............... H01L 31/03048
(Continued)

FOREIGN PATENT DOCUMENTS

DE    202009011260 U1   10/2009
EP    0528311 A2        2/1993
(Continued)

OTHER PUBLICATIONS

Mitchell et al: "Epitaxy Wrap-Through Rear Contact Solar Cell Fabrication and Results," 24th European Photovoltaic Solar Energy Conference, Sep. 21-25, 2009, pp. 2362-2365.

*Primary Examiner* — Earl N Taylor
(74) *Attorney, Agent, or Firm* — Muncy, Geissler, Olds & Lowe, P.C.

(57) ABSTRACT

A protection method for through-holes of a semiconductor wafer having the steps: providing a semiconductor wafer, and comprising a plurality of solar cell stacks, wherein each solar cell stack has a Ge substrate forming a bottom side of the semiconductor wafer, a Ge subcell, and at least two III-V subcells in the order mentioned, as well as at least one through-hole, extending from the top side to the bottom side of the semiconductor wafer, with a continuous side wall and a circumference that is oval in cross section; applying a photoresist layer to a top side of the semiconductor wafer and to at least one region of the side wall of the through-hole, said region adjoining the top side, and applying an organic filler material by means of a printing process to a region of the top side, said region comprising the through-hole, and into the through-hole.

9 Claims, 2 Drawing Sheets

(58) Field of Classification Search
CPC ........... H01L 31/022441; H01L 31/186; H01L 31/184; H01L 31/1876
See application file for complete search history.

(56) References Cited

U.S. PATENT DOCUMENTS

| | | |
|---|---|---|
| 2006/0231130 A1 | 10/2006 | Sharps et al. |
| 2011/0272020 A1* | 11/2011 | Biro ...................... H01L 31/068 136/256 |
| 2014/0048128 A1* | 2/2014 | Meitl ................ H01L 31/02008 136/255 |
| 2017/0213922 A1* | 7/2017 | Lucow .................. H01L 31/076 |
| 2018/0366598 A1* | 12/2018 | Lucow .............. H01L 31/02168 |
| 2021/0066515 A1* | 3/2021 | Frey .................. H01L 31/02167 |
| 2021/0066532 A1* | 3/2021 | Frey ...................... H01L 31/184 |
| 2021/0066534 A1* | 3/2021 | Koestler ............. H01L 31/0687 |

FOREIGN PATENT DOCUMENTS

| | | |
|---|---|---|
| EP | 1715529 A2 | 10/2006 |
| WO | WO89/05521 A1 | 6/1989 |

\* cited by examiner

PROTECTION METHOD FOR THROUGH-HOLES OF A SEMICONDUCTOR WAFER

This nonprovisional application claims priority under 35 U.S.C. § 119(a) to German Patent Application No. 10 2019 006 093.8, which was filed in Germany on Aug. 29, 2019, and which is herein incorporated by reference.

BACKGROUND OF THE INVENTION

Field of the Invention

The present invention relates to a protection method for through-holes of a semiconductor wafer.

Description of the Background Art

In order to reduce the shading of the front side of a solar cell, it is possible to arrange both the positive and the negative external contact surface on the back side. In the case of so-called metal wrap through (MWT) solar cells, the solar cell front side is contacted from the back side, for example, by a through-contact hole.

Different methods are known for producing a hole or a through-contact hole through a solar cell. The metallization running through the through-hole is insulated from the solar cell stack layers by means of an insulation layer.

For example, a solar cell stack made up of multiple III-V subcells on a GaAs substrate with a back-contacted front side is known from U.S. Pat. No. 9,680,035 B1, wherein a hole extending from the top side of the solar cell through the subcells into a substrate layer that has not yet been thinned is produced by means of a wet chemical etching process. The etching process is based on the fact that the etch rates do not differ significantly, at least for the employed different III-V materials of the solar cell stack. Passivation and metallization of the front side and the hole are carried out before the substrate layer is thinned.

If the passivation, therefore, an insulation layer, is applied in a planar manner, for example, on the front side of the solar cell stack and the side surface of the through-contact hole, then the through-contact hole must be reliably protected from the subsequent patterning of the insulation layer on the front side.

It is known, for example, to coat surfaces, in particular with holes, by means of a film. Such films are offered, for example, by the company DuPont as DuPont Dry Film Resists and sold, e.g., by micro resist technology GmbH, Berlin.

SUMMARY OF THE INVENTION

It is therefore an object of the present invention to provide a device that refines the state of the art.

According to an exemplary embodiment of the invention, a protection method for through-holes of a semiconductor wafer is provided, at least comprising the steps: providing a semiconductor wafer having a top side and a bottom side, and comprising a plurality of solar cell stacks, wherein each solar cell stack has a Ge substrate forming the bottom side of the semiconductor wafer, a Ge subcell, and at least two III-V subcells in the order mentioned, as well as at least one through-hole, extending from the top side to the bottom side of the semiconductor wafer, with a continuous side wall and a circumference that is oval in cross section; applying a photoresist layer to the top side and to at least one region of the side wall of the semiconductor wafer side, said region adjoining the top side; and/or applying an organic filler material by means of a printing process to a top side region, comprising the through-hole, and into the through-hole.

It is understood that the photoresist layer is exposed and developed. The two steps are preferably carried out before further layers are applied.

An advantage is that the additional application of the organic filler material provides reliable protection for the insulation layer in the area of the through-hole.

The time and technical expenditure for the additional process step is low due to the application by means of a printing process, e.g., screen printing or inkjet or dispenser.

A further advantage is that a very efficient and reliable solar cell can be produced by this in a simple and economical manner.

The photoresist layer can be applied additionally to the bottom side of the semiconductor wafer before or after or during the application to the top side of the semiconductor wafer.

In an example, after the filler material has been applied to a region of the semiconductor wafer top side, the region comprising the through-hole, the filler material is additionally applied by means of a printing process to a part of the bottom side of the semiconductor wafer, said part comprising the through-hole, and into the through-hole.

Before the photoresist layer is applied, a dielectric insulation layer can be applied in a planar manner to the top side of the semiconductor wafer and the side wall of the through-hole and/or the bottom side of the semiconductor wafer.

After the organic filler material has been applied, the photoresist layer can be removed from partial areas of the top side and/or the bottom side of the semiconductor wafer, parts of the dielectric insulation layer exposed by removing the photoresist layer are removed, and a remaining part of the photoresist layer is removed, wherein the steps mentioned are carried out in the order mentioned.

The through-hole is filled with the filler material at least up to a bottom formed by the photoresist layer by means of the printing method, and a raised area protruding beyond the top side of the photoresist layer is formed with the filler material.

The printing method may be a screen printing method or an inkjet method or a dispensing method.

The filler material can be a lacquer or a hot-melt adhesive.
The filler material can also be a wax, a resin, an adhesive, or a thermoplastic.

The through-hole of the semiconductor wafer provided can have a first diameter of at most 1 mm and at least 50 µm at an edge adjacent to the top side of the semiconductor wafer.

At an edge adjacent to the bottom side of the semiconductor wafer, the through-hole has a second diameter of at most 1 mm and of at least 50 µm.

The semiconductor wafer provided can have a total thickness of at most 300 µm and of at least 90 µm.

Further scope of applicability of the present invention will become apparent from the detailed description given hereinafter. However, it should be understood that the detailed description and specific examples, while indicating preferred embodiments of the invention, are given by way of illustration only, since various changes, combinations, and modifications within the spirit and scope of the invention will become apparent to those skilled in the art from this detailed description.

BRIEF DESCRIPTION OF THE DRAWINGS

The present invention will become more fully understood from the detailed description given herein below and the accompanying drawings which are given by way of illustration only, and thus, are not limitive of the present invention, and wherein.

DETAILED DESCRIPTION

Figure 1:
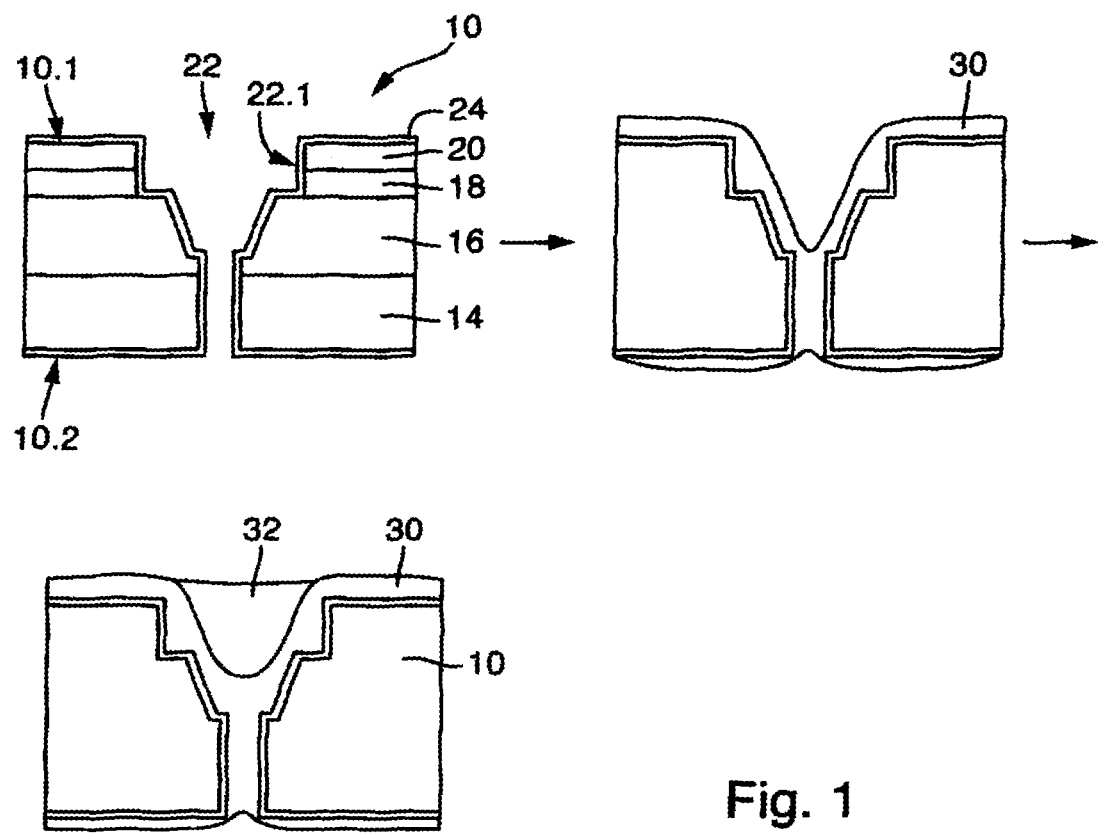
FIG. 1 shows a sequence according to an exemplary embodiment of a protection method of the invention for through-holes of a semiconductor wafer.

The diagram in FIG. 1 shows a schematic sequence of a protection method for through-holes of a semiconductor wafer according to a first embodiment of the invention.

A semiconductor wafer 10 is provided having a top side 10.1, a bottom side 10.2, and a through-hole 22, which extends securely from top side 10.1 to bottom side 10.2, with a continuous side wall 22.1 and a circumference that is oval in cross section.

Semiconductor wafer 10 comprises multiple not yet separated solar cell stacks 12, each with a layer sequence of a Ge substrate 14 forming bottom side 10.1, a Ge subcell 16, a first III-V subcell 18, and a second III-V subcell 20 forming top side 10.1. Top side 10.1, bottom side 10.2, and side wall 22.1 of the through-hole are coated with a dielectric insulation layer 24.

A photoresist layer 30 is then applied to top side 10.1 and bottom side 10.2 of semiconductor wafer 10 and to side wall 22.1 of through-hole 22, wherein photoresist layer 30 typically fills the through-hole at least partially.

In a further process step, an organic filler material 32 is applied by means of a printing process to a region of top side 10.1 of through-hole 22, said region comprising through-hole 22, wherein the filler material in the shown exemplary embodiment fills the through-hole up to a bottom formed by photoresist layer 30.

Figure 2:
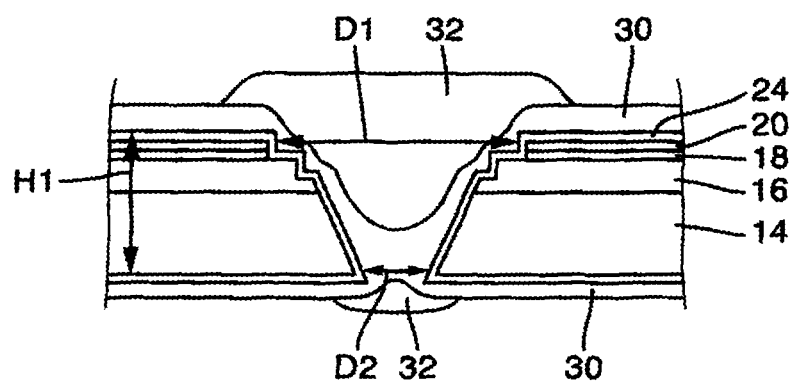
FIG. 2 shows a cross section of a semiconductor wafer through-hole coated by means of the protection method of the invention.

A further embodiment is shown in the diagram in FIG. 2. Only the differences from the diagram in FIG. 1 will be explained below.

In the embodiment shown, the applied filler material 32 forms an elevation protruding beyond the photoresist layer.

In addition, in a further process step, organic filler material 32 is applied by means of a printing process to a region of bottom side 10.2, said region comprising through-hole 22, wherein an elevation protruding beyond the photoresist layer is also formed.

Through-hole 22 has a first diameter D1 on top side 10.1 of the semiconductor wafer and a second diameter D2 on bottom side 20.2, wherein first diameter D1 is larger than second diameter D2.

Figure 3:
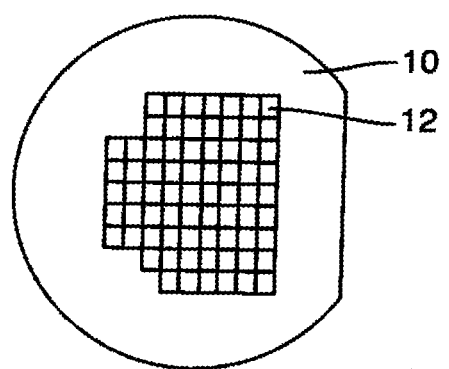
FIG. 3 shows a plan view of a semiconductor wafer with a plurality of solar cell stacks.

A plan view of a semiconductor wafer 10 with a plurality of solar cell stacks 12 is shown in the diagram in FIG. 3. According to one embodiment of the invention, there is at least one hole, coated by means of the protection method, in the area of each solar cell stack.

The invention being thus described, it will be obvious that the same may be varied in many ways. Such variations are not to be regarded as a departure from the spirit and scope of the invention, and all such modifications as would be obvious to one skilled in the art are to be included within the scope of the following claims.

What is claimed is:

1. A protection method for through-holes of a semiconductor wafer, the method comprising:

providing a semiconductor wafer having a top side and a bottom side, and comprising at least two solar cell stacks, each of the at least two solar cell stacks has a Ge substrate forming the bottom side of the semiconductor wafer, a Ge subcell, and at least two III-V subcells, as well as at least one through-hole extending from the top side to the bottom side of the semiconductor wafer with a continuous side wall and a circumference that is oval in cross section;

applying a photoresist layer to the top side of the semiconductor wafer and to at least one region of the side wall of the through-hole, the at least one region adjoining the top side; and applying an organic filler material via a printing process to a region of the top side and into the through-hole, the region comprising the through-hole.

2. The method according to claim 1, wherein the photoresist layer is applied additionally to the bottom side of the semiconductor wafer before or after or during the application to the top side of the semiconductor wafer.

3. The method according to claim 2, wherein, after the filler material has been applied to a region of the top side of the semiconductor wafer, the region comprising the through-hole, the filler material is additionally applied via a printing process to a part of the bottom side of the semiconductor wafer, the part comprising the through-hole, and into the through-hole.

4. The method according to claim 1, wherein, before the photoresist layer is applied, a dielectric insulation layer is applied in a planar manner to the top side of the semiconductor wafer and the side wall of the through-hole and/or the bottom side of the semiconductor wafer.

5. The method according to claim 4, wherein, after the organic filler material has been applied, the photoresist layer is removed from partial areas of the top side and/or the bottom side of the semiconductor wafer, wherein parts of the dielectric insulation layer exposed by the removing of the photoresist layer are removed and a remaining part of the photoresist layer is removed, and wherein the steps mentioned are carried out in the order mentioned.

6. The method according to claim 1, wherein the through-hole is filled with the filler material at least up to a bottom formed by the photoresist layer via the printing method, and a raised area protruding beyond the top side of the photoresist layer is formed with the filler material.

7. The method according to claim 1, wherein the printing method is a screen printing method or an inkjet method or a dispensing method.

8. The method according to claim 1, wherein the filler material is a lacquer or a hot melt adhesive.

9. The method according to claim 1, wherein the through-hole of the semiconductor wafer provided has a first diameter of at most 1 mm and at least 50 µm at an edge adjacent to the top side of the semiconductor wafer, and has a second diameter of at most 1 mm and of at least 50 µm at an edge adjacent to the bottom side of the semiconductor wafer, and wherein the semiconductor wafer provided has a total thickness of at most 300 µm and of at least 90 µm.

* * * * *